United States Patent
Adin et al.

(10) Patent No.: US 6,810,297 B2
(45) Date of Patent: Oct. 26, 2004

(54) SYSTEM AND METHODS FOR IMAGING EMPLOYING A LEVITATING CONVEYOR

(75) Inventors: Raanan Adin, Rishon Lezion (IL); Yuval Yassour, Haifa (IL)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 10/329,759

(22) Filed: Dec. 27, 2002

(65) Prior Publication Data

US 2003/0169524 A1 Sep. 11, 2003

Related U.S. Application Data

(60) Provisional application No. 60/342,374, filed on Dec. 27, 2001.

(51) Int. Cl.[7] .............................................. G06F 19/00
(52) U.S. Cl. ...................... 700/110; 294/64.3; 414/737; 901/40; 700/121
(58) Field of Search ................................ 700/110, 121; 294/64.3; 414/737; 901/40

(56) References Cited

U.S. PATENT DOCUMENTS

| | | | |
|---|---|---|---|
| 2,848,820 A | | 8/1958 | Wallin et al. |
| 3,223,500 A | | 12/1965 | Misson |
| 3,318,640 A | | 5/1967 | Coville |
| 3,449,102 A | | 6/1969 | Nedelec et al. |
| 4,092,366 A | * | 5/1978 | Oroshnik ............... 568/824 |
| 4,362,461 A | * | 12/1982 | Cathers ............... 198/370.12 |
| 4,712,784 A | * | 12/1987 | Carrell ............... 271/108 |
| 4,784,218 A | * | 11/1988 | Holl ............... 165/109.1 |
| 4,832,500 A | * | 5/1989 | Brunold et al. ............... 366/268 |
| 5,048,804 A | * | 9/1991 | Ito ............... 269/21 |
| 5,156,680 A | * | 10/1992 | Orzechowski ............... 118/46 |
| 5,207,386 A | * | 5/1993 | Mehoudar ............... 239/542 |
| 5,207,553 A | * | 5/1993 | Konagai ............... 414/737 |
| 5,437,784 A | * | 8/1995 | Meinecke et al. ............... 209/170 |
| 5,439,341 A | | 8/1995 | Yamazaki et al. |
| 5,502,306 A | * | 3/1996 | Meisburger et al. ............... 250/310 |
| 5,603,599 A | * | 2/1997 | Wesslen et al. ............... 414/411 |
| 5,632,962 A | * | 5/1997 | Baker et al. ............... 422/211 |
| 5,779,361 A | * | 7/1998 | Sugiura ............... 366/340 |
| 5,803,602 A | * | 9/1998 | Eroglu et al. ............... 366/337 |
| 5,830,515 A | * | 11/1998 | Pleasant et al. ............... 425/192 R |
| 5,839,828 A | * | 11/1998 | Glanville ............... 366/340 |
| 5,967,658 A | * | 10/1999 | Mohajer ............... 366/337 |
| 6,147,320 A | * | 11/2000 | Bernecker et al. ............... 219/121.68 |
| 6,252,412 B1 | * | 6/2001 | Talbot et al. ............... 324/750 |
| 6,583,413 B1 | * | 6/2003 | Shinada et al. ............... 250/310 |
| 2003/0201391 A1 | * | 10/2003 | Shinada et al. ............... 250/307 |

FOREIGN PATENT DOCUMENTS

| | | |
|---|---|---|
| FR | 1 342 552 | 11/1935 |
| FR | 1 477 171 | 4/1967 |
| WO | WO 01/14752 | 3/2001 |
| WO | WO 01/14782 | 3/2001 |
| WO | WO 01/19572 | 3/2001 |

* cited by examiner

Primary Examiner—Leo Picard
Assistant Examiner—Michael D. Masinick
(74) Attorney, Agent, or Firm—Sughrue Mion, PLLC

(57) ABSTRACT

A system and methodology for conveying generally planar substrates such as printed circuit board, flat panel display and interconnect device substrates, in a levitated state, to and from a scanning or imaging location, including an air flow conveyor having a substrate flattening functionality, and a scanning or imaging device, and scanning and imaging systems and methodologies employing such article conveying systems and methodologies.

35 Claims, 6 Drawing Sheets

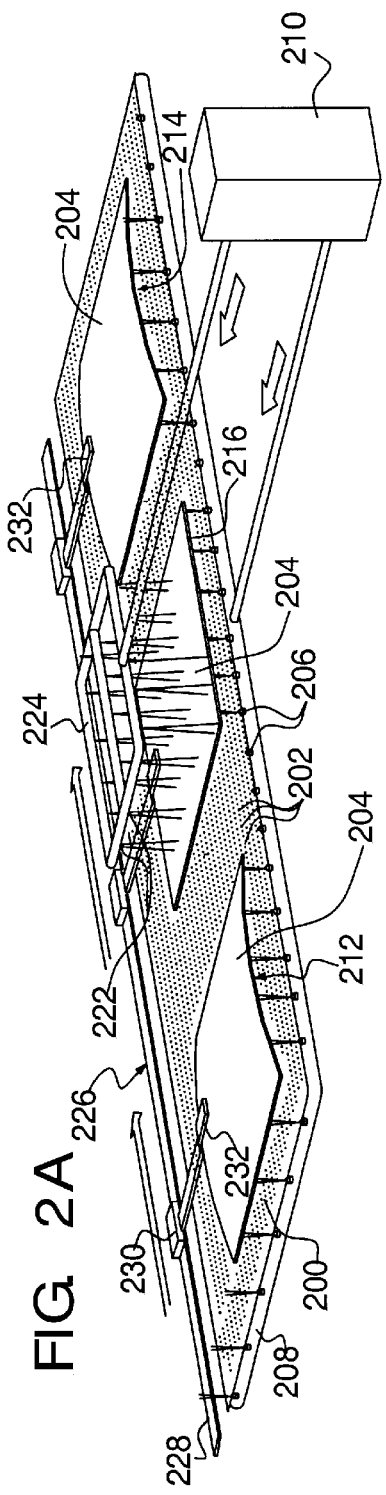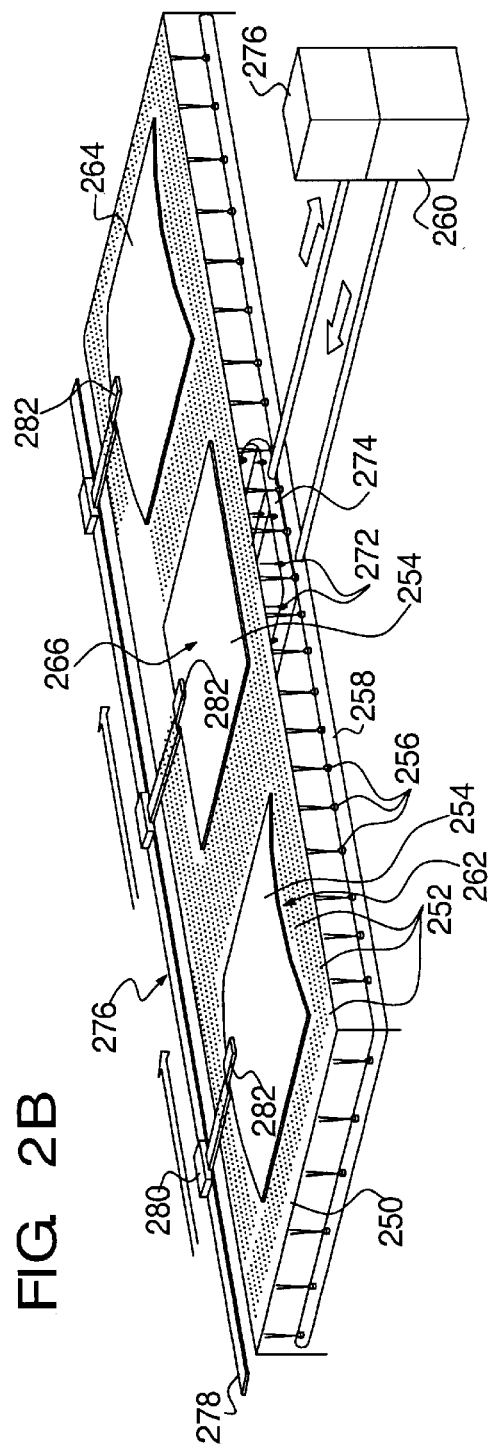

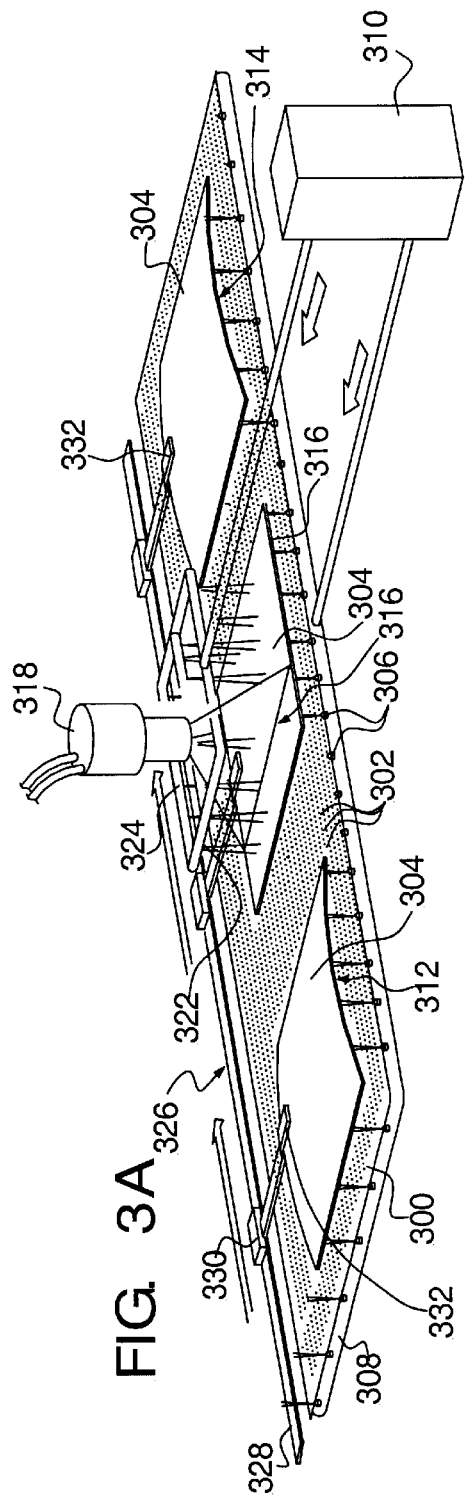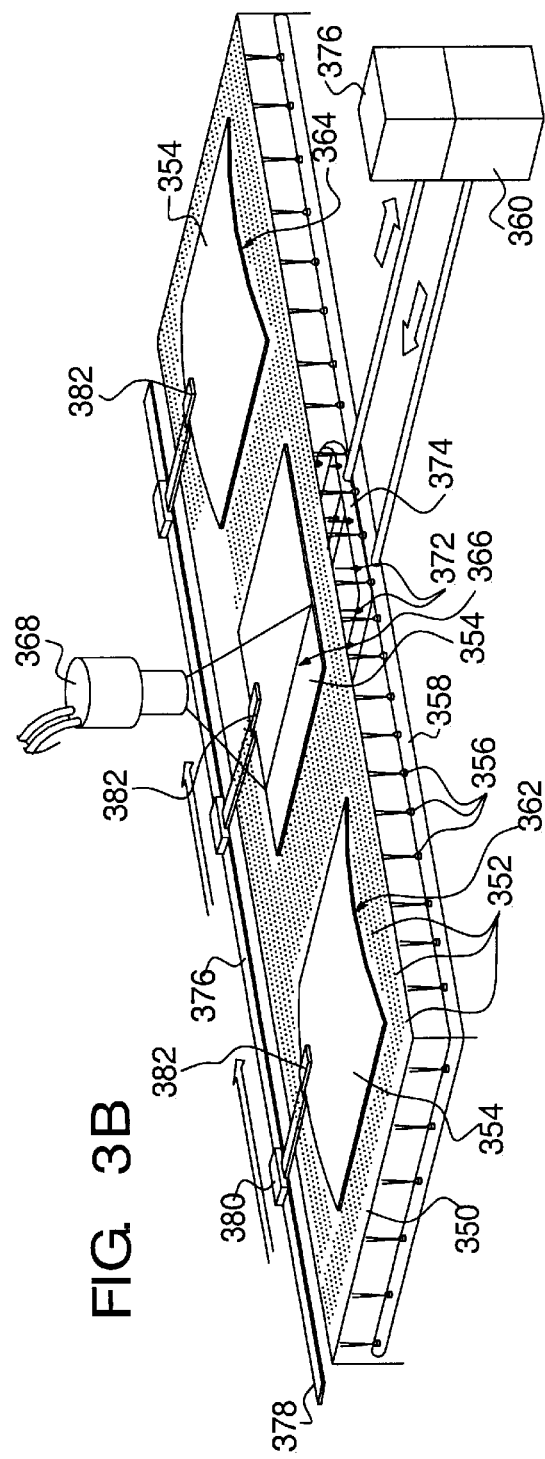

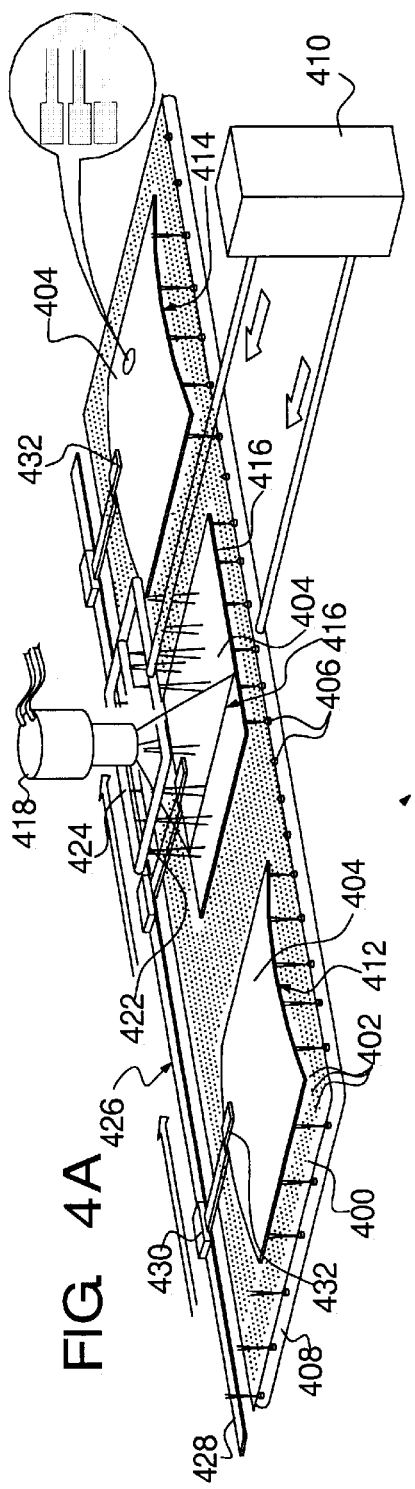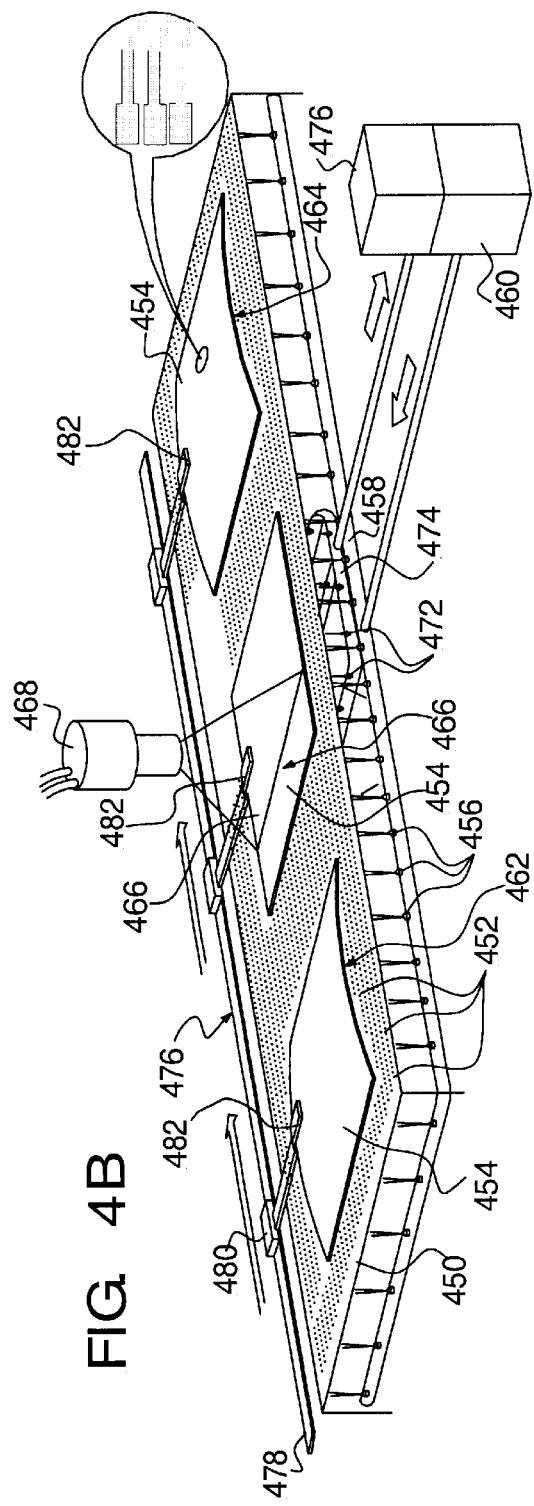

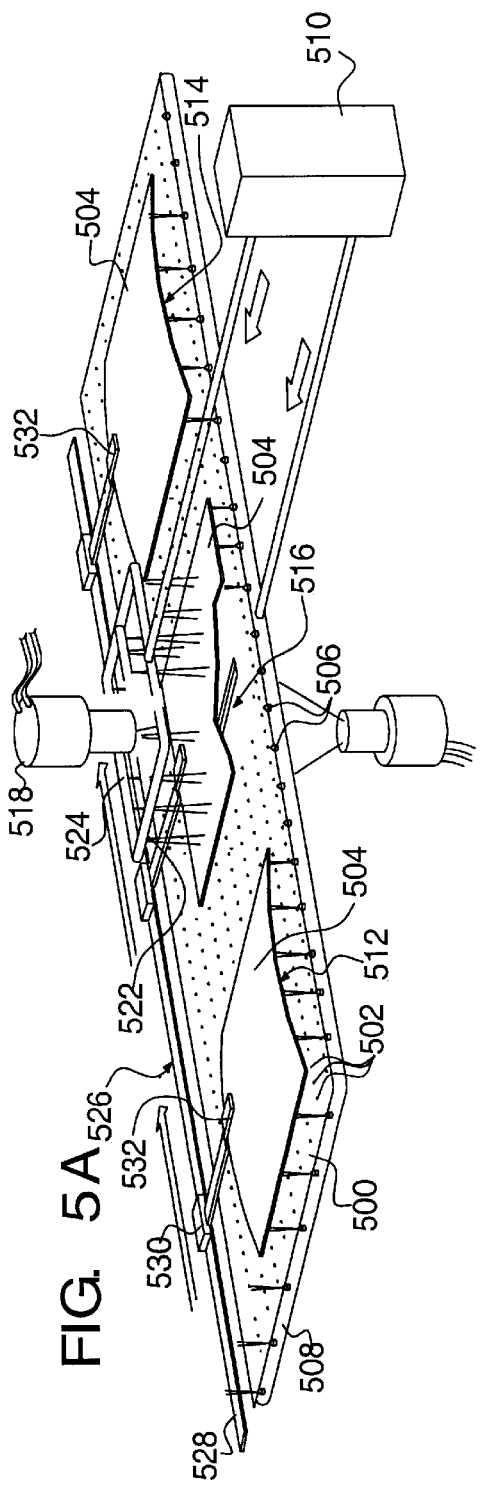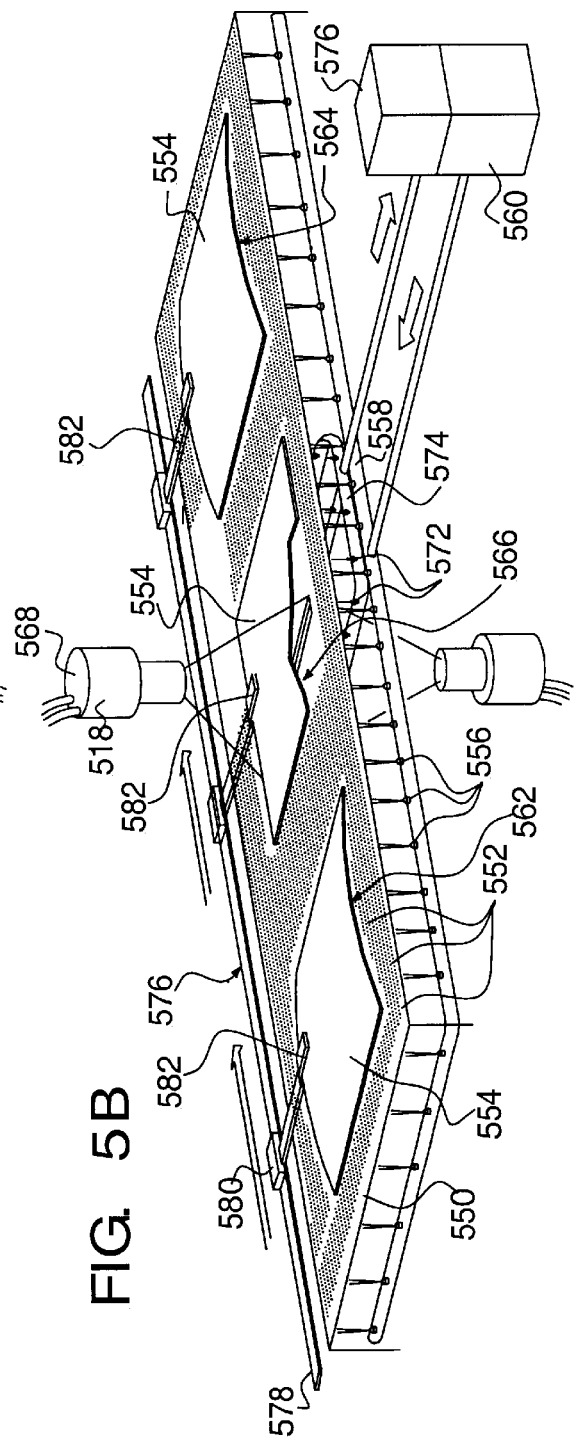

SYSTEM AND METHODS FOR IMAGING EMPLOYING A LEVITATING CONVEYOR

CROSS REFERENCE TO RELATED APPLICATION

This application claims the benefit of U.S. Provisional Patent Application No. 60/342,374, filed Dec. 27, 2001, the disclosure of which is incorporated by reference in its entirety.

FIELD OF THE INVENTION

The present invention relates to article transport and conveying systems and methodologies generally, and more particularly to imaging systems and methodologies employing such transport and conveying systems.

BACKGROUND OF THE INVENTION

Systems and methodologies for transporting and conveying articles that are suitable for use in imaging systems, such as laser direct write systems and inspection systems, are characterized, inter alia, by highly precise and highly repeatable rates of transport. Moreover such systems and methodologies are configured to maintain articles in a precise predetermined orientation, including a precise distance, relative to an imager and are configured to minimize mechanical disturbance to an article being transported at the imager by other articles that are being uploaded to or offloaded from the system.

SUMMARY OF THE INVENTION

A general aspect of the present invention relates to improved article transport and conveying systems and methodologies employing an article levitator levitating an article during transporting and conveying. A flattener is provided to ensure that a levitated portion of the article is precisely held in a desired orientation relative to a processor during processing. Preferably the flattener operates in a non-contact manner.

Such transport and conveying systems may be employed for transporting and conveying generally planar substrates, particularly wherever there is required one or more of the following: a relatively high degree of uniformity in the rate of transport, a high degree of precision in the orientation of the substrate in relation to a processor (for example an image acquisition system or an image creator), or avoidance of disturbance to a substrate during process, for example due to the loading or unloading of other substrates onto or off of the transport and conveying system. Typical applications of such systems include inspection and testing, such as automated optical inspection, electrical testing and functional testing, of flat panel displays and electrical circuits such as printed circuit boards and semiconductor wafers, and image formation on a photosensitized surface such as in-fabrication flat panel displays, electrical circuits, reticules and photo tools. Other typical applications included systems for conveying planar sheet material such as metal foils, planar plastic laminates and any other suitable sheet material.

There is thus provided in accordance with a preferred embodiment of the present invention an imaging system for use with generally planar substrates including an air flow conveyor operative to convey planar substrates at least to an imaging location, the air flow conveyor having an air flow substrate flattening functionality at least at the imaging location; and an imager located at the imaging location for imaging the planar substrates when flattened by the air flow substrate flattening functionality.

Additionally, the air flow conveyor may be operative to convey the planar substrates away from the imaging location.

Preferably, the imager includes an image acquirer, such as an automated optical inspection device electrical testing, metrology or any other suitable image acquisition device. Alternatively or additionally, the imager may include an image creator such as a modulated laser scanner.

The air flow conveyor preferably includes an air flow levitator. Alternatively or additionally, the air flow conveyor may include an air flow hold down. Alternatively or additionally, the air flow conveyor may include a displacer for displacing the planar substrates towards the imaging location or away from the imaging location or both.

The air flow substrate flattening functionality, preferably, includes a vacuum hold down. Alternatively or additionally, the air flow flattening functionality includes an air flow evacuator or outlet operative to release air build up beneath the planar substrate. Alternatively or additionally, the air flow substrate flattening functionality includes an air flow hold down. Preferably, the vacuum hold down, or the air flow hold down, are operative in combination with the air flow levitator to hold the substrate a precise distance from a reference surface.

There is also provided in accordance with a preferred embodiment of the present invention a two-sided imaging system for use with generally planar substrates including an air flow conveyor operative to convey planar substrates in a levitated state at least to an imaging location; and an imager located at the imaging location for imaging two opposite sides of the planar substrates when levitated by the air flow conveyor.

Additionally, the air flow conveyor may be operative to convey the planar substrates away from the imaging location.

Preferably, the imager includes an image acquirer, such as automatic optical inspection device. Alternatively or additionally, the imager may include an image creator. Optionally the imager provides illumination from a first side of a planar substrate and acquires an image from the opposite side of the substrate.

Preferably, the air flow conveyor includes air flow substrate flattening functionality at least at the imaging location.

The air flow conveyor, preferably, includes an air flow hold down or a vacuum hold down. Alternatively or additionally, the air flow conveyor may include a displacer for displacing the planar substrates towards the imaging location or away from the imaging location or both.

The air flow substrate flattening functionality preferably includes a vacuum hold down. Alternatively or additionally, the air flow flattening functionality includes an air flow evacuator. Alternatively or additionally, the air flow substrate flattening functionality includes an air flow hold down. Preferably, the vacuum hold down, or the air flow hold down, are operative in combination with the air flow levitator to hold the substrate a precise distance from a reference surface.

There is also provided in accordance with a preferred embodiment of the present invention an air flow conveyor system including: an air flow generator; and an air flow levitating conveyor operative to convey planar substrates. Preferably, the air flow conveyor includes: a displacer for displacing the planar substrates; and an air flow substrate flattener operative at least at one region of the levitating conveyor to flatten the planar substrate when in a levitated state.

The air flow conveyor, preferably, includes an air flow hold down.

The air flow substrate flattening functionality, preferably, includes, a vacuum hold down. Alternatively or additionally, the air flow flattening functionality includes an air flow evacuator. Alternatively or additionally, the air flow substrate flattening functionality includes an air flow hold down. Preferably, the vacuum hold down, or the air flow hold down, are operative in combination with the air flow levitator to hold the substrate a precise distance from a reference surface.

There is also provided in accordance with a preferred embodiment of the present invention a flat bed scanner system including: an air flow conveyor operative to convey planar substrates to be scanned at least to a scanning location, the air flow conveyor having an air flow substrate flattening functionality at least at the scanning location; and a scanner located at the scanning location for scanning the planar substrates when flattened by the air flow substrate flattening functionality.

Additionally, the air flow conveyor may be operative to convey the planar substrates away from the imaging location.

Preferably, the scanner includes, in part, an image acquirer. Alternatively or additionally, the scanner may include, in part, an image creator. Optionally, the scanner is a laser scanner employing a rotating polygon.

Preferably, the planar substrates include a photosensitive layer, where the image creator includes a data modulated laser beam device operative to expose a desired pattern on the photosensitive layer.

The air flow conveyor, preferably, includes an air flow levitator. Alternatively or additionally, the air flow conveyor includes an air flow hold down or a vacuum hold down. Alternatively or additionally, the air flow conveyor may include a displacer for displacing the planar substrates towards the imaging location or away from the imaging location or both.

The air flow substrate flattening functionality preferably includes a vacuum hold down. Alternatively or additionally, the air flow flattening functionality includes an air flow evacuator. Alternatively or additionally, the air flow substrate flattening functionality includes an air flow hold down. Preferably, the vacuum hold down, or the air flow hold down, are operative in combination with the air flow levitator to hold the substrate a precise distance from a reference surface.

There is also provided in accordance with a preferred embodiment of the present invention a levitated conveyor system including: a levitator operative to levitate planar substrates with respect to a surface; and a displacer for displacing the planar substrates generally parallel to the surface; The conveyor system additionally includes a substrate flattener operative to flatten the planar substrate when in a levitated state.

Preferably, the levitator includes an air flow levitator.

Preferably, the substrate flattener includes a positive pressure device. Alternatively or additionally, the substrate flattener includes a vacuum or suction pressure device forming a region of sub-atmospheric pressure. Preferably, the flattener is operative in combination with the levitator to hold the substrate a precise distance from the surface.

There is also provided in accordance with a preferred embodiment of the present invention a methodology for imaging generally planar substrates including: conveying the planar substrates, employing an air flow conveyor, to at least an imaging location, the air flow conveyor having an air flow substrate flattening functionality at least at the imaging location; and imaging the generally planar substrates, employing an imager located at the imaging location, when the generally planar substrates are flattened by the air flow substrate flattening functionality.

The conveying may also include conveying the planar substrates away from the imaging location.

The imaging preferably includes image acquisition. Alternatively or additionally, the imaging includes image creation. Optionally, imaging includes illuminating a substrate from a first side and acquiring an image from the opposite side thereof.

The air flow conveyor preferably includes an air flow levitator. Alternatively or additionally, the air flow conveyor includes an air flow hold down. The air flow conveyor also, preferably, includes a displacer for displacing the planar substrates towards the imaging location or away from the imaging location or both.

Preferably, the air flow substrate flattening functionality includes an a vacuum hold down. Alternatively or additionally, the air flow flattening functionality includes an air flow evacuator. Alternatively or additionally, the air flow substrate flattening functionality includes an air flow hold down. Preferably, the vacuum hold down, or the air flow hold down, are operative in combination with the air flow levitator to hold the substrate a precise distance from a reference surface.

There is also provided in accordance with a preferred embodiment of the present invention a methodology for two-sided imaging of generally planar substrates including: conveying the planar substrates in a levitated state, employing an air flow conveyor, to at least an imaging location; and imaging two opposite sides of the planar substrates when levitated by the air flow conveyor, employing an imager located at the imaging location.

The conveying may also include conveying the planar substrates away from the imaging location.

The imaging preferably includes image acquisition. Alternatively or additionally, the imaging includes image creation. Optionally, imaging includes illuminating a substrate from a first side and acquiring an image from the opposite side thereof.

Preferably, the air flow conveyor includes air flow substrate flattening functionality at least at the imaging location. Alternatively or additionally, the air flow flattening functionality includes an air flow evacuator. Alternatively or additionally, the air flow conveyor includes an air flow hold down. Preferably, the vacuum hold down, or the air flow hold down, are operative in combination with the air flow levitator to hold the substrate a precise distance from a reference surface. The air flow conveyor also, preferably, includes a displacer for displacing the planar substrates towards the imaging location or away from the imaging location or both.

Preferably, the air flow substrate flattening functionality includes vacuum hold down. Alternatively or additionally, the air flow substrate flattening functionality includes an air flow hold down.

There is also provided in accordance with a preferred embodiment of the present invention an air flow conveying methodology including: generating an air cushion beneath a generally planar substrate using an air flow generator; and conveying planar substrates using an air flow levitating conveyor. The conveying includes: displacing the planar substrates using a displacer; and flattening the planar substrates when in a levitated state, the flattening employing an air flow substrate flattener at least at one region of the levitating conveyor. The flattening positions at least a portion of the substrate in a given plane of reference in a levitated state.

Preferably, the air flow conveyor includes an air flow hold down. Preferably, the air flow substrate flattening functionality includes vacuum hold down. Alternatively or additionally, the air flow flattening functionality includes an air flow evacuator or outlet operative to release air build up beneath the planar substrate. Alternatively or additionally, the air flow substrate flattening functionality includes an air flow hold down. Preferably, the vacuum hold down, or the air flow hold down, are operative in combination with the air flow levitator to hold the substrate a precise distance from a reference surface.

There is also provided in accordance with a preferred embodiment of the present invention a methodology for scanning generally planar substrates including: conveying planar substrates to be scanned, employing an air flow conveyor, to at least a scanning location, the air flow conveyor having an air flow substrate flattening functionality at least at the scanning location; and scanning the planar substrates, employing a scanner located at the scanning location, when flattened by the air flow substrate flattening functionality.

The conveying may also include conveying the planar substrates away from the imaging location.

The scanning preferably includes, in part, image acquisition. Alternatively or additionally, the scanning includes, in part, image creation.

Preferably, the planar substrates include a photosensitive layer. Preferably, the image creation includes exposing a desired pattern on the photosensitive layer, employing a modulated laser beam device.

The air flow conveyor preferably includes an air flow levitator. Alternatively or additionally, the air flow conveyor includes an air flow hold down or a vacuum hold down. Alternatively or additionally, the air flow flattening functionality includes an air flow evacuator. Preferably, the vacuum hold down, or the air flow hold precise distance from a reference surface.

The air flow conveyor also, preferably, includes a displacer for displacing the planar substrates towards the imaging location or away from the imaging location or both.

Preferably, the air flow substrate flattening functionality includes an air flow levitator. Alternatively or additionally, the air flow substrate flattening functionality includes an air flow hold down.

There is also provided in accordance with a preferred embodiment of the present invention a levitating methodology for conveying generally planar substrates including: levitating planar substrates with respect to a surface, employing a levitator; displacing the planar substrates generally parallel to the surface employing a displacer; and flattening the planar substrates when in a levitated state, employing a substrate flattener.

In an embodiment of the invention the levitating includes vacuum levitation.

Preferably, the substrate flattener includes a positive pressure device. Alternatively or additionally, the substrate flattener includes a a vacuum or suction device forming a region of sub-atmospheric pressure.

BRIEF DESCRIPTION OF THE DRAWINGS

The present invention will be understood and appreciated more fully from the following detailed description, taken in conjunction with the drawings in which:

FIG. 2A is a simplified illustration of a levitated conveyor system constructed and operative in accordance with a preferred embodiment of the present invention;

FIG. 2B is a simplified illustration of a levitated conveyor system constructed and operative in accordance with another preferred embodiment of the present invention;

FIG. 3A is a simplified illustration of a portion of a levitated inspection system constructed and operative in accordance with a preferred embodiment of the present invention;

FIG. 3B is a simplified illustration of a portion of a levitated inspection system constructed and operative in accordance with another preferred embodiment of the present invention;

FIG. 4A is a simplified illustration of a portion of a levitated imaging system constructed and operative in accordance with a preferred embodiment of the present invention;

FIG. 4B is a simplified illustration of a portion of a levitated imaging system constructed and operative in accordance with another preferred embodiment of the present invention;

FIG. 5A is a simplified illustration of a portion of a levitated two-sided imaging system constructed and operative in accordance with a preferred embodiment of the present invention;

FIG. 5B is a simplified illustration of a portion of a levitated two-sided imaging system constructed and operative in accordance with another preferred embodiment of the present invention.

DETAILED DESCRIPTION OF PREFERRED EMBODIMENTS

Figure 1A:
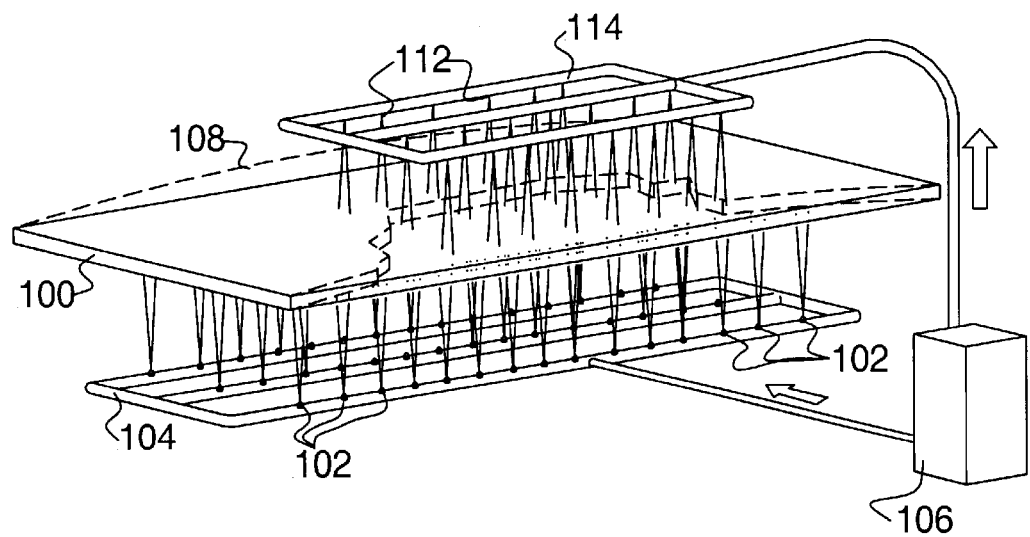
FIG. 1A is a simplified illustration of a portion of a levitated conveyor system constructed and operative in accordance with a preferred embodiment of the present invention.

Reference is now made to FIG. 1A, which is a simplified illustration of a portion of a levitated conveyor system constructed and operative in accordance with a preferred embodiment of the present invention. As seen in FIG. 1A, a generally planar substrate 100 is levitated by a pressure cushion, for example by a flow of fluid, preferably air, from a multiplicity of nozzles 102 connected via a manifold 104 to a source of positive fluid pressure 106.

As used herein the term "flow of fluid" or "air flow" refers to the formation of a region of pressure, greater than atmospheric pressure, at least in the vicinity of a substrate. The formation of such a region of pressure may be done for example by generating an active flow of fluid. Alternatively the formation of such a region of pressure may be done without generating an active flow of fluid, or by generating an insignificant active flow of fluid, for example using apparatus and methods described in published PCT Patent Application WO 01/14782 A1, published PCT Patent Application WO 01/14752 A1 and published PCT Patent Application WO 01/19572 A1. As used herein, the term generally "planar substrate" refers to any suitable generally planar sheet material such as, for example, paper, cardboard, metallic sheet, glass, fiberglass sheets, celluloid, sheet film, silicon wafers and the like. Uses of such materials include planar substrates bearing pixel arrays employed in flat panel displays, mask works employed in electrical circuit production, printed circuit board substrates bearing portions of an electrical circuit pattern, semiconductor chips and interconnect devices interconnecting between semiconductor chips and printed circuit boards. Generally planar substrates include planar sheet materials which already have formed thereupon portions of a flat panel display or of an electrical circuit, as well as planar sheet materials which are suitable to have formed thereupon flat panel display portions or electrical circuit patterns. The generally planar surface may have a photosensitized surface, for example a photoresist material deposited thereon.

It is appreciated that when a generally planar substrate 100 is levitated as seen in FIG. 1A, normally the planar substrate 100 would be bowed, or otherwise not uniformly flat, as shown in dashed lines at reference numeral 108. In order to flatten the planar substrate 100, at least over a given portion thereof, there is provided, in accordance with a preferred embodiment of the present invention, a suction such as a counter flow of fluid, preferably air, preferably from a multiplicity of nozzles 112 connected via a manifold 114 to the source of positive fluid pressure 106. In the embodiment of FIG. 1A, nozzles 112 and manifold 114 are located on an opposite side of the planar substrate 100 from where a pressure cushion provided by nozzles 102 is formed.

Figure 1B:
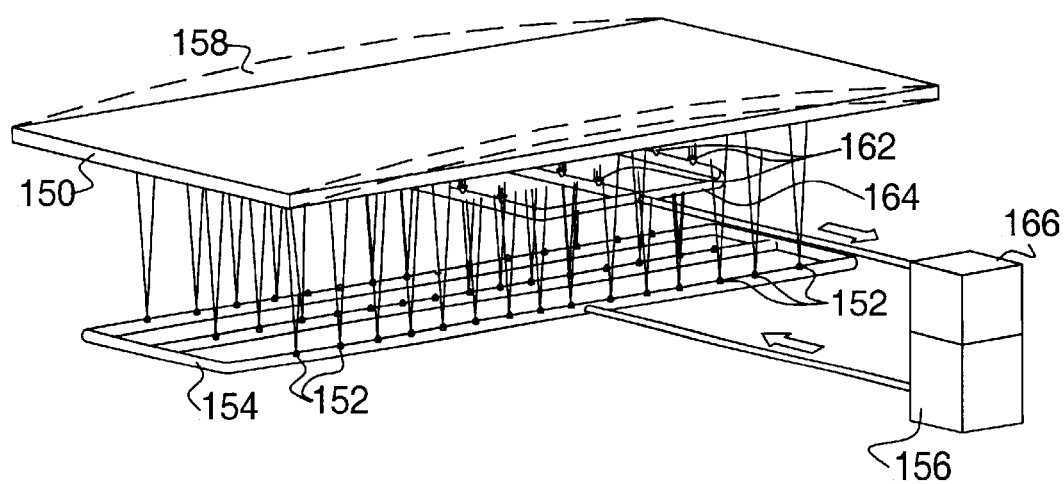
FIG. 1B is a simplified illustration of a portion of a levitated conveyor system constructed and operative in accordance with another preferred embodiment of the present invention.

Reference is now made to FIG. 1B, which is a simplified illustration of a portion of a levitated conveyor system constructed and operative in accordance with another embodiment of the present invention. As seen in FIG. 1B, a generally planar substrate 150 is levitated by a pressure cushion, for example a flow of fluid, preferably air, from a multiplicity of nozzles 152 connected via a manifold 154 to a source of positive fluid pressure 156.

It is appreciated that in such a case, normally the planar substrate 150 would be bowed, or otherwise not uniformly flat, as shown in dashed lines at reference numeral 158. In order to flatten the planar substrate 150, at least over a given portion thereof, there is provided, in accordance with a preferred embodiment of the present invention, suction from a multiplicity of nozzles 162 connected via a manifold 164 to a source of suction 166. In the embodiment of FIG. 1B, nozzles 162 and manifold 164 are located on the same side of the planar substrate 150 as that where a pressure cushion is provided by nozzles 152. An example of a particular embodiment of levitated conveyor system for conveying a planar substrate and employing a levitating flow of a fluid in conjunction with a suction is generally described in PCT patent application PCT/IL02/01045 to Core Flow Ltd., entitled *High Performance Non-Contact Support Platforms* (Attorney Docket 1203/20), and filed on Dec. 27, 2002, the disclosure of which is incorporated by reference in its entirety.

It is appreciated that alternatively any other suitable type of levitation may be employed, such as, for example, magnetic levitation, in conjunction with a suitable article.

Reference is now made to FIG. 2A, which is a simplified illustration of a levitated conveyor system constructed and operative in accordance with a preferred embodiment of the present invention. As seen in FIG. 2A, the levitated conveyor system preferably includes a static levitation table 200 including a multiplicity of apertures 202. A generally planar substrate 204 is levitated by a pressure cushion, for example provided by a flow of fluid, preferably air, from a multiplicity of nozzles 206, preferably in communication with corresponding apertures 202, in a manifold 208 that is connected to a source of positive fluid pressure 210.

It is appreciated that absent the presence of a counter-flow of fluid, or other suitable hold down force, the levitated planar substrate may be bowed, or otherwise not uniformly flat, as shown at reference numerals 212 and 214. As shown in FIG. 2A, at a location 216 along the levitation table 200, where it is desired that the planar substrate be flattened, there is provided, in accordance with a preferred embodiment of the present invention, a counter flow of fluid, preferably air, forming a counter pressure cushion, preferably from a multiplicity of nozzles 222 connected via a manifold 224 to the source of positive fluid pressure 210. In the embodiment of FIG. 2A, nozzles 222 and manifold 224 are located on an opposite side of the planar substrate 204 from that where a pressure cushion is provided by nozzles 206.

The levitated conveyor system of FIG. 2A preferably also includes at least one displacer 226 for moving the levitated planar substrate along and preferably parallel to table 200. The displacer 226 preferably comprises a track 228 disposed parallel to the table 200. A carriage assembly 230 is driven along track 228 and preferably includes grippers 232 which engage the planar substrate 204 and cause it to be displaced parallel to track 228. It is appreciated that alternatively, any other suitable type of contact or non-contact displacer, such as a pusher or puller, may be employed. It is noted that when levitated, for example by an pressure cushion, substrate 204 can be readily laterally displaced, that displacer 226 does not need to support the full weight of substrate 204 and that displacer 226 only needs to provide a displacing functionality.

Reference is now made to FIG. 2B, which is a simplified illustration of a levitated conveyor system constructed and operative in accordance with a preferred embodiment of the present invention. As seen in FIG. 2B, the levitated conveyor system preferably includes a static levitation table 250 including a multiplicity of apertures 252. A generally planar substrate 254 is levitated by a flow of fluid, preferably air, from a multiplicity of nozzles 256, preferably in communication with corresponding apertures 252, in a manifold 258 that is connected to a source of positive fluid pressure 260.

It is appreciated that absent the presence of a counter-flow of fluid, or other suitable hold down force, the levitated planar substrate may be bowed, or otherwise not uniformly flat, as shown at reference numerals 262 and 264. As shown in FIG. 2B, at a location 266 along the levitation table 250, where it is desired that the planar substrate be flattened, there is provided, in accordance with an embodiment of the present invention, a counter flow of fluid. The counter flow may be simply a fluid evacuator providing an outlet for evacuating air accumulating between planar substrate 254 and static levitation table 250. Preferably counter flow is a vacuum flow or suction operative to hold at least a portion of planar substrate 254 in a plane that is located a precise distance from the surface of table 200. The counter flow preferably is provided by a multiplicity of nozzles 272 connected via a manifold 274 to a source of suction 276. In the embodiment of FIG. 2B, nozzles 272 and manifold 274 are located on the same side of the planar substrate 254 as that where a pressure cushion provided by nozzles 256 in communication with suitable apertures 252 is formed.

The levitated conveyor system of FIG. 2B preferably also includes a displacer 276 for moving the levitated planar substrate, along and preferably parallel to table 250. The displacer 276 preferably comprises a track 278 disposed parallel to the table 250. A carriage assembly 280 is driven along track 278 and preferably includes grippers 282 which engage the planar substrate 254 and cause it to be displaced parallel to track 278. It is appreciated that alternatively, any other suitable type of contact or non-contact displacer, such as a pusher or puller, may be employed.

It is a particular feature of the embodiment of FIG. 2B that at least some of the nozzles 256 and 272 are coupled to an adaptive orifice device which limits the fluid flow therethrough in the absence of a levitated planar surface in operative engagement therewith. The adaptive orifice devices may be conveniently located in communication with apertures 252 in table 250. Preferred embodiments of adaptive orifice devices operative to provide a pressure cushion, or suction, with reduced flow of air are described in the following references, the disclosures of which are hereby incorporated by reference in their entirety:

Published PCT Patent Application WO 01/14782 A1
Published PCT Patent Application WO 01/14752 A1
Published PCT Patent Application WO 01/19572 A1.

It is appreciated that any other suitable adaptive or non-adaptive orifice devices may be used.

Reference is now made to FIG. 3A, which is a simplified illustration of a portion of a levitated inspection system constructed and operative in accordance with a preferred embodiment of the present invention. As seen in FIG. 3A, the levitated inspection system preferably includes a static levitation table 300 including a multiplicity of apertures 302. A generally planar substrate 304 is levitated by a pressure cushion, for example provided by a flow of fluid, preferably air, from a multiplicity of nozzles 306, preferably in communication with corresponding apertures 302, that are connected via a manifold 308 to a source of positive fluid pressure 310.

It is appreciated that absent the presence of a counter-flow of fluid, or other suitable hold down force, the levitated planar substrate 304 may be bowed, or otherwise not uniformly flat, as shown at reference numerals 312 and 314. As shown in FIG. 3A, at an inspection location 316 along the levitation table 300, at which an inspection device 318, such as a laser scanner or other suitable, for example generally white light, optical imager, is operative, it is desired that the planar substrate 304 be flattened or otherwise maintained in a precise given orientation relative to inspection device 318. Accordingly, there is provided, in a preferred embodiment of the present invention, a counter flow of fluid, preferably air, forming a counter pressure cushion, preferably from a multiplicity of nozzles 322 connected via a manifold 324 to the source of positive fluid pressure 310. In the embodiment of FIG. 3A, nozzles 322 and manifold 324 are located on an opposite side of the planar substrate 304 from that where a pressure cushion is provided by nozzles 306.

The levitated inspection system of FIG. 3A preferably also includes at least one displacer 326 for moving the levitated planar substrate, along and preferably parallel to table 300. The displacer 326 preferably comprises a track 328 disposed parallel to the table 300. A carriage assembly 330 is driven along track 328 and preferably includes grippers 332 which engage the planar substrate 304 and cause it to be displaced parallel to track 328. It is appreciated that alternatively, any other suitable type of contact or non-contact displacer, such as a pusher or puller, may be employed. It is noted that when levitated, for example by an pressure cushion, substrate 304 can be readily laterally displaced, that displacer 326 does not need to support the full weight of substrate 304 and that displacer 326 only needs to provide a displacing functionality.

Reference is now made to FIG. 3B, which is a simplified illustration of a levitated inspection system constructed and operative in accordance with a preferred embodiment of the present invention. As seen in FIG. 3B, the levitated conveyor system preferably includes a static levitation table 350 including a multiplicity of apertures 352. A generally planar substrate 354 is levitated by a flow of fluid, preferably air, from a multiplicity of nozzles 356, preferably communicating with corresponding apertures 352, which are connected via a manifold 358 to a source of positive fluid pressure 360.

It is appreciated that absent the presence of a counter-flow of fluid, or other suitable hold down force, the levitated planar substrate may be bowed or otherwise not uniformly flat, as shown at reference numerals 362 and 364. As shown in FIG. 3B, at an inspection location 366 along the levitation table 350, at which an inspection device 368, such as a laser scanner or other suitable scanner, for example a generally white light optical imager, is operative, it is desired that the planar substrate be flattened or otherwise maintained in a given orientation relative to, for example a precise distance from, inspection device 368.

Accordingly, there is provided, in a preferred embodiment of the present invention, a counter flow of fluid. The counter flow may be simply provided by a fluid evacuator providing an outlet for evacuating air accumulating between planar substrate 354 and static levitation table 350. Preferably the counter flow of fluid is a vacuum flow or suction operative to hold at least a portion of planar substrate 354 in a plane that is located a precise distance from the surface of table 300, or any other suitable reference surface. The counter flow preferably is provided by a multiplicity of nozzles 372 connected via a manifold 374 to a source of suction 376. In the embodiment of FIG. 3B, nozzles 372 and manifold 374 are located on the same side of the planar substrate 354 as that where a pressure cushion provided by nozzles 356 in communication with suitable apertures 352 is formed.

The levitated conveyor system of FIG. 3B preferably also includes a displacer 376 for moving the levitated planar substrate, along and preferably parallel to table 350. The displacer 376 preferably comprises a track 378 disposed parallel to the table 350. A carriage assembly 380 is driven along track 378 and preferably includes grippers 382 which engage the planar substrate 354 and cause it to be displaced parallel to track 378. It is appreciated that alternatively, any other suitable type of contact or non-contact displacer, such as a pusher or puller, may be employed.

It is a particular feature of the embodiment of FIG. 3B that at least some of the nozzles 356 and 372 are coupled to an adaptive orifice device which limits the fluid flow therethrough in the absence of a levitated planar surface in operative engagement therewith. The adaptive orifice devices may be conveniently located in communication with apertures 352 in table 350. Preferred embodiments of adaptive orifice devices operative to provide a pressure cushion, or suction, with reduced flow of air are described in the following references, the disclosures of which are hereby incorporated by reference in their entirety:

Published PCT Patent Application WO 01/14782 A1
Published PCT Patent Application WO 01/14752 A1
Published PCT Patent Application WO 01/19572 A1.

It is appreciated that any other suitable adaptive or non-adaptive orifice devices may be used.

Reference is now made to FIG. 4A, which is a simplified illustration of a portion of a levitated imaging system constructed and operative in accordance with a preferred embodiment of the present invention. The imaging system of FIG. 4A may be an image acquisition system or an image writing system or both. In the illustrated embodiment, an image writing system is shown, it being understood that the structure described is applicable also to an image acquisition system or to a combined image acquisition and writing system and corresponding methodologies.

As seen in FIG. 4A, the levitated imaging system preferably includes a static levitation table 400 including a multiplicity of apertures 402. A generally planar substrate 404 is levitated by a pressure cushion, for example provided by a flow of fluid, preferably air, from a multiplicity of nozzles 406, preferably in communication with corresponding apertures 402, that are connected via a manifold 408 to a source of positive fluid pressure 410.

It is appreciated that absent the presence of a counter-flow of fluid, or other suitable hold down force, the levitated planar substrate 404 may be bowed, or otherwise not uniformly flat, as shown at reference numerals 412 and 414. As shown in FIG. 4A, at an imaging location 416 along the levitation table 400, there is provided an imaging device 418, such as a flat bed plotter functioning as a direct imager forming a pattern on the surface of planar substrate 404, preferably in association with a planar substrate having a photosensitive layer. Imaging device 418 is optionally a laser scanner employing a rotating polygon (not shown) to scan a data modulated laser beam across the surface of planar substrate 404.

At the imaging location 416, it is desired that the planar substrate be flattened or otherwise maintained in a given orientation relative to imaging device 418 during imaging. Accordingly, there is provided, in a preferred embodiment of the present invention, a counter flow of fluid, preferably air, forming a counter pressure cushion, preferably from a multiplicity of nozzles 422 connected via a manifold 424 to the source of positive fluid pressure 410. In the embodiment of FIG. 4A, nozzles 422 and manifold 424 are located on an opposite side of the planar substrate 404 from that where a pressure cushion is provided by nozzles 406.

The levitated imaging system of FIG. 4A preferably also includes at least one displacer 426 for moving the levitated planar substrate, along and preferably parallel to table 400. The displacer 426 preferably comprises a track 428 disposed parallel to the table 400. A carriage assembly 430 is driven along track 428 and preferably includes grippers 432 which engage the planar substrate 404 and cause it to be displaced parallel to track 428. It is appreciated that alternatively, any other suitable type of contact or non-contact displacer, such as a pusher or puller, may be employed. It is noted that when levitated, for example by an pressure cushion, substrate 404 can be readily laterally displaced, that displacer 426 does not need to support the full weight of substrate 404 and that displacer 426 only needs to provide a displacing functionality.

Reference is now made to FIG. 4B, which is a simplified illustration of a portion of a levitated imaging system constructed and operative in accordance with a preferred embodiment of the present invention. The imaging system of FIG. 4B may be an image acquisition system or an image writing system or both. In the illustrated embodiment, an image writing system is shown, it being understood that the structure described is applicable also to an image acquisition system or to a combined image acquisition and writing system and corresponding methodologies, or to any other processing requiring a portion of a substrate to be located a very precise distance from a processing station.

As seen in FIG. 4B, the levitated imaging system preferably includes a static levitation table 450 including a multiplicity of apertures 452. A generally planar substrate 454 is levitated by a pressure cushion, for example provided by a flow of fluid, preferably air, from a multiplicity of nozzles 456, preferably in communication with corresponding apertures 452, that are connected via a manifold 458 to a source of positive fluid pressure 460.

It is appreciated that absent the presence of a counter-flow of fluid, or other suitable hold down force, the levitated planar substrate may be bowed, or otherwise not uniformly flat, as shown in at reference numerals 462 and 464. As shown in FIG. 4B, at an imaging location 466 along the levitation table 450, there is provided an imaging device 468, such as a flat bed plotter functioning as a direct imager forming a pattern on the surface of planar substrate 454, preferably in association with a planar substrate having a photosensitive layer. Imaging device 468 is optionally a laser scanner employing a rotating polygon (not shown) to scan a data modulated laser beam across the surface of planar substrate 404.

At the imaging location 466, it is desired that the planar substrate be flattened or otherwise maintained in a given orientation relative to, for example a precise distance from, imaging device 418 during imaging. Accordingly, there is provided, in a preferred embodiment of the present invention, a counter flow of fluid. The counter flow may be simply a fluid evacuator providing an outlet for evacuating air accumulating between planar substrate 454 and static levitation table 450. Preferably counter flow is a vacuum flow operative to hold at least a portion of planar substrate 450 in a plane that is located a precise distance from the surface of table 400. The counter flow preferably is provided by multiplicity of nozzles 472 connected via a manifold 474 to a source of suction 476. In the embodiment of FIG. 4B, nozzles 472 and manifold 474 are located on the same side of the planar substrate 454 as that where a pressure cushion provided by nozzles 456 in communication with suitable apertures 452 is formed.

The levitated imaging system of FIG. 4B preferably also includes at least one displacer 476 for moving the levitated planar substrate, along and preferably parallel to table 450. The displacer 476 preferably comprises a track 478 disposed parallel to the table 450. A carriage assembly 480 is driven along track 478 and preferably includes grippers 482 which engage the planar substrate 454 and cause it to be displaced parallel to track 478. It is appreciated that alternatively, any other suitable type of contact or non-contact displacer, such as a pusher or puller, may be employed.

It is a particular feature of the embodiment of FIG. 4B that at least some of the nozzles 456 and 472 are coupled to an adaptive orifice device which limits the fluid flow therethrough in the absence of a levitated planar surface in operative engagement therewith. The adaptive orifice devices may be conveniently located in communication with apertures 452 in table 450. Preferred embodiments of adaptive orifice devices operative to provide a pressure cushion, or suction, with reduced flow of air are described in the following references, the disclosures of which are hereby incorporated by reference in their entirety:

Published PCT Patent Application WO 01/14782 A1
Published PCT Patent Application WO 01/14752 A1
Published PCT Patent Application WO 01/19572 A1.

It is appreciated that any other suitable adaptive or non-adaptive orifice devices may be used.

Reference is now made to FIG. 5A, which is a simplified illustration of a portion of a levitated two-sided imaging system constructed and operative in accordance with a preferred embodiment of the present invention. The two-sided imaging system of FIG. 5A may be an image acquisition system, such as one useful in inspection, or an image writing system or both. In the illustrated embodiment, an inspection system is shown, it being understood that the general structure described is applicable also to any other image acquisition system, image writing system, combined image acquisition and writing system, or system for processing substrates in which at least a portion of the substrate needs to be positioned a very precise distance from a processing station, and corresponding methodologies.

As seen in FIG. 5A, the levitated two-sided imaging system preferably includes a static levitation table 500 including a multiplicity of apertures 502. A generally planar substrate 504 is levitated by a pressure cushion, for example provided by a flow of fluid, preferably air, from a multiplicity of nozzles 506, preferably in communication with corresponding apertures 502, that are connected via a manifold 508 to a source of positive fluid pressure 510.

It is appreciated that absent the presence of a counter-flow of fluid, or other suitable hold down force, the levitated planar substrate may be bowed, or otherwise not uniformly flat, as shown in at reference numerals 512 and 514. As shown in FIG. 5A, at an imaging location 516 along the levitation table 500, there is provided a two-sided imaging device 518.

It is appreciated that the two-sided imaging device may comprise a pair of imaging devices or an integrated two-sided imaging device. The imaging device which is disposed to image the underside of the planar substrate, i.e. the side facing the table 500, preferably views the planar substrate through a gap or a transparent portion of the table 500 which is not interfered with by the levitating and flattening functionalities.

At the imaging location 516, it is desired that the planar substrate 504 be flattened or otherwise maintained in a given precise orientation relative to two-sided imaging device 518. Accordingly, there is provided, in a preferred embodiment of the present invention, a counter flow of fluid, preferably air, forming a counter pressure cushion preferably from a multiplicity of nozzles 522 connected via a manifold 524 to the source of positive fluid pressure 510. In the embodiment of FIG. 5A, nozzles 522 and manifold 524 are both located on an opposite side of the planar substrate 504 from that where a pressure cushion is provided by nozzles 506.

The levitated two-sided imaging system of FIG. 5A preferably also includes a displacer 526 for moving the levitated planar substrate, along and preferably parallel to table 500. The displacer 526 preferably comprises a track 528 disposed parallel to the table 500. A carriage assembly 530 is driven along track 528 and preferably includes grippers 532 which engage the planar substrate 504 and cause it to be displaced parallel to track 528. It is appreciated that alternatively, any other suitable type of contact or non-contact displacer, such as a pusher or puller, may be employed. It is noted that when levitated, for example by an pressure cushion, substrate 504 can be readily laterally displaced, that displacer 526 does not need to support the full weight of planar substrate 504 and that displacer 526 only needs to provide a displacing functionality.

Reference is now made to FIG. 5B, which is a simplified illustration of a levitated two-sided imaging system constructed and operative in accordance with a preferred embodiment of the present invention. The two-sided imaging system of FIG. 5B may be for example an image acquisition system, such as one useful in inspection, or an image writing system or both. In the illustrated embodiment, an inspection system is shown, it being understood that the structure described is applicable also to any other image acquisition system, image writing system, combined image acquisition and writing system or any other processing system requiring a substrate to be positioned a precise distance from a processing station, and corresponding methodologies.

As seen in FIG. 5B, the levitated two-sided imaging system preferably includes a static levitation table 550 including a multiplicity of apertures 552. A generally planar substrate 554 is levitated by a pressure cushion, for example provided by a flow of fluid, preferably air, from a multiplicity of nozzles 556, preferably in communication with corresponding apertures 552, that are connected via a manifold 558 to a source of positive fluid pressure 560.

It is appreciated that absent the presence of a counter-flow of fluid, or other suitable hold down force, the levitated planar substrate 554 may be bowed or otherwise not uniformly flat, as shown in at reference numerals 562 and 564. As shown in FIG. 5B, at an imaging location 566 along the levitation table 550, there is provided a two-sided imaging device 568.

It is appreciated that the two-sided imaging device may comprise a pair of imaging devices or an integrated two-sided imaging device, or an illuminator illuminating first side of planar substrate 554 and an imager acquiring an image of light passing through the planar substrate 554. The imaging device which is disposed to image the underside of the planar substrate, i.e. the side facing the table 500, preferably views the planar substrate through a gap or a transparent portion of the table 550 which is not interfered with by the levitating and flattening functionalities.

At the imaging location 566, it is desired that the planar substrate 554 be flattened or otherwise maintained in a given orientation relative to, for example a precise distance from, two-sided imaging device 568. Accordingly, there is provided, in a preferred embodiment of the present invention, a counter flow of fluid. The counter flow may be simply a fluid evacuator providing an outlet for evacuating air accumulating between planar substrate 554 and static levitation table 550. Preferably counter flow is a vacuum flow operative to hold at least a portion of planar substrate 554 in a plane that is located a precise distance from the surface of table 500, or any other suitable reference surface. The counter flow preferably is provided by a multiplicity of nozzles 572 connected via a manifold 574 to a source of suction 576. In the embodiment of FIG. 5B, nozzles 572 and manifold 574 are located on the same side of the planar substrate 554 as that where a pressure cushion provided by nozzles 556 in communication with suitable apertures 552 is formed.

The levitated two-sided imaging system of FIG. 5B preferably also includes a displacer 576 for moving the levitated planar substrate, along and preferably parallel to table 550. The displacer 576 preferably comprises a track 578 disposed parallel to the table 550. A carriage assembly 580 is driven along track 578 and preferably includes grippers 582 which engage the planar substrate 554 and cause it to be displaced parallel to track 578. It is appreciated that alternatively, any other suitable type of contact or non-contact displacer, such as a pusher or puller, may be employed.

It is a particular feature of the embodiment of FIG. 5B that at least some of the nozzles 556 and 572 are coupled to an adaptive orifice device which limits the fluid flow therethrough in the absence of a levitated planar surface in operative engagement therewith. The adaptive orifice devices may be conveniently located in communication with apertures 552 in table 550. Preferred embodiments of adaptive orifice devices operative to provide a pressure cushion, or suction, with a reduced flow of air are described in the following references, the disclosures of which are hereby incorporated by reference in their entirety:

Published PCT Patent Application WO 01/14782 A1
Published PCT Patent Application WO 01/14752 A1
Published PCT Patent Application WO 01/19572 A1.

It is appreciated that any other suitable adaptive or non-adaptive orifice devices may be used.

Figure 6:
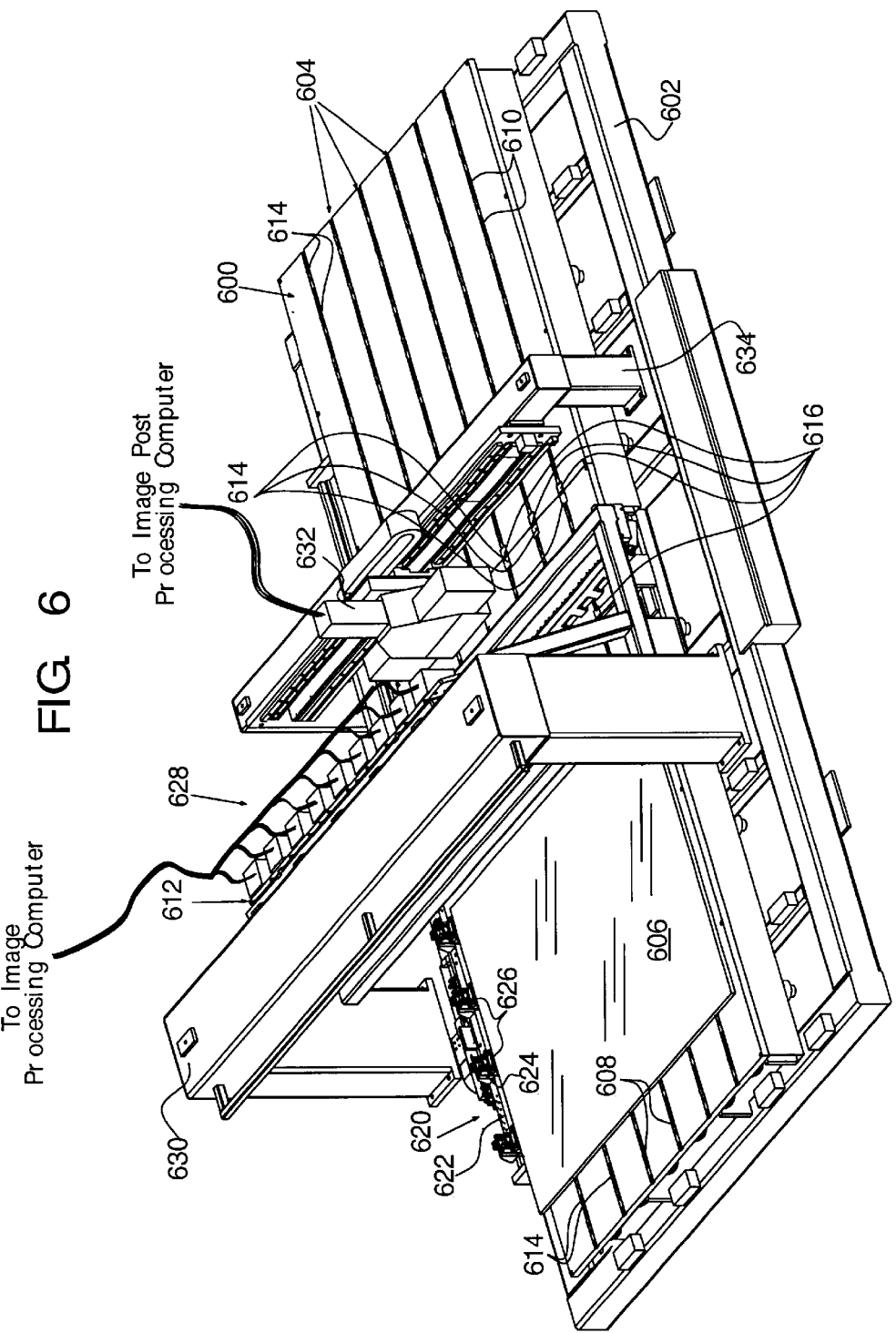
FIG. 6 is a simplified illustration of an electrical circuit inspection system constructed and operative in accordance with a preferred embodiment of the present invention.

Reference is now made to FIG. 6, which is a simplified illustration of inspection system, particularly useful for the inspection of in-fabrication flat panel displays, constructed and operative in accordance with a preferred embodiment of the present invention. As seen in FIG. 6, a static levitating table 600 is mounted on a chassis 602. Table 600 is preferably formed with a plurality of longitudinally extending slits 604. Disposed in slits 604 are two sets of selectably raisable rollers for receiving and conveying a generally planar substrate 606, such as an in-fabrication flat panel display or printed circuit board.

The two sets of selectably raisable rollers preferably include an input set 608, which receives and conveys a generally planar substrate 606 to be inspected and an output set 610, which receives and conveys a generally planar substrate 606 from an inspection station 612 after inspection. It is appreciated that inspection station may include any suitable optical inspection sensor, or other suitable device operative to sense a desired physical attribute of generally planar substrate 606.

Disposed in slits 604 are a multiplicity of levitation nozzles 614 which are operative to produce selectable levitation of generally planar substrates 606. Nozzles 614 preferably are coupled via a manifold (not shown) to a source of positive fluid pressure (not shown).

It is a particular feature of the embodiment of FIG. 6 that at least some of the nozzles 614 are coupled to an adaptive orifice device which limits the fluid flow therethrough, particularly in the absence of a levitated planar surface in operative engagement therewith. Preferred embodiments of adaptive orifice devices are described in the following references, the disclosures of which are hereby incorporated by reference in their entirety:

Published PCT Patent Application WO 01/14782 A1
Published PCT Patent Application WO 01/14752 A1
Published PCT Patent Application WO 01/19572 A1.

At the inspection station 612, it is desired that the generally planar substrate 606 be flattened and held at a precise distance from the surface of table 600 (or from imagers such as cameras 628) as it is transported therethrough. Accordingly, in addition to levitation nozzles 614, there is provided, in a preferred embodiment of the present invention, a counter flow of fluid, preferably suction or a vacuum flow, preferably to a multiplicity of counter-force nozzles 616, connected via a manifold (not shown) to a source of suction (not shown). In the embodiment of FIG. 6, counter-force nozzles 616 are located in the vicinity of inspection station 612 on the same side of planar electrical circuit 606 as that impinged by the fluid flow from levitation nozzles 614.

The inspection system of FIG. 6 also includes a displacer 620 for moving the levitated generally planar substrates 606 along and preferably parallel to table 600 when selectable raisable rollers are retracted into slits 604. The displacer 620 preferably comprises a track 622 disposed parallel to the table 600. A carriage assembly 624 is driven along track 622 and preferably includes grippers 626 which engage the planar electrical circuits 606 and cause them to be displaced parallel to track 622. It is appreciated that alternatively, any other suitable type of contact or non-contact displacer, such as a pusher or puller, may be employed. It is noted that when levitated, for example by an pressure cushion, substrate 606 can be readily laterally displaced, that displacer 620 does not need to support the full weight of planar substrate 606 and that displacer 620 only needs to provide a displacing functionality.

Preferably, the inspection station 612 comprises a plurality of static cameras 628, preferably mounted on a first bridge 630 spanning table 600, and connected to an image processing computer (not shown). Inspection station 612 preferably also comprises a movable video camera 632, preferably mounted on a second bridge 634, downstream of first bridge 630, spanning table 600, and connected to a image post processing computer (not shown). A movable video camera 632 is preferably operative in response to inputs received from the image processing computer (not shown) for selectably viewing portions of the generally planar substrate 606 which are suspected as being defective.

It will be appreciated by persons skilled in the art that the present invention is not limited by what has been particularly shown and described hereinabove. Rather the scope of the present invention includes both combinations and subcombinations of the various features described hereinabove as well as variations and modifications which would occur to persons skilled in the art upon reading the specification and which are not in the prior art.

What is claimed is:

1. A method for manufacturing an electrical circuit comprising:

forming a portion of an electrical circuit pattern on a substrate, said substrate selected from the group consisting of printed circuit board, flat panel display and interconnect device substrates;

conveying said substrate with an air flow conveyor to at least an imaging location;

acquiring an image of said pattern while said substrate is flattened with an air flow substrate flattener; and analyzing said image to detect defects in said portion of an electrical circuit pattern.

2. The method according to claim 1 and wherein said conveying comprises conveying with an air flow levitator.

3. The method according to claim 2 and wherein said acquiring an image comprises conveying said substrate while at least partially flattened with an cushion.

4. The method according to claim 2 and wherein said acquiring an image comprises conveying said substrate while at least partially flattened by suction.

5. The method according to claim 1 and wherein said conveying also comprises conveying said substrate away from said imaging location.

6. The method according to claim 1 and wherein said conveying includes displacing said substrate in a levitated state at least towards said imaging location.

7. The method according to claim 1 and wherein said conveying includes displacing said substrate in a levitated state away from said imaging location.

8. The method according to claim 1 and wherein said acquiring an image comprises operating an optical inspection sensor.

9. The method according to claim 8 and wherein said optical inspection sensor comprises at least one staring array camera.

10. The method according to claim 8 and wherein said optical inspection sensor comprises a scanning camera.

11. The method according to claim 1 and wherein said analyzing comprises sensing a desired physical attribute of said substrate.

12. The method according to claim 1 and wherein said analyzing comprises transmitting said image to an image processing computer.

13. The method according to claim 1 and wherein said analyzing comprises acquiring at least one additional image of an area of said pattern suspected of having a defect.

14. An imaging system for use with generally planar substrates comprising:

an air flow conveyor operative to convey planar substrates at least to an imaging location, said air flow conveyor having an air flow substrate flattening functionality at least at said imaging location; and an imager located at said imaging location for imaging said planar substrate when flattened by said air flow substrate flattening functionality.

15. An imaging system according to claim 14 and wherein said imager is an image acquirer.

16. An imaging system according to claim 14 and wherein said imager is an image creator.

17. An imaging system according to claim 14 and wherein said air flow conveyor comprises an air flow levitator.

18. An imaging system according to claim 14 and wherein said air flow conveyor comprises an air flow hold down.

19. An imaging system according to claim 14 and wherein said air flow substrate flattening functionality comprises an air flow levitator.

20. An imaging system according to claim 14 and wherein said air flow substrate flattening functionality comprises an air flow hold down.

21. An imaging system according to claim 14 and wherein said air flow conveyor is also operative to convey said planar substrate away from said imaging location.

22. An imaging system according to claim 14 and wherein said air flow conveyor includes a displacer for displacing said planar substrate at least towards said imaging location.

23. An imaging system according to claim 14 and wherein said air flow conveyor includes a displacer for displacing said planar substrates away from said imaging location.

24. An imaging system according to claim 14 and wherein said planar substrates comprise an electrical circuit substrate selected from the group consisting of: printed circuit board substrates, flat panel display substrates an device substrates.

25. A method for imaging generally planar substrates comprising:

conveying said planar substrates with an air flow conveyor to at least an imaging location;

flattening said planar substrates with an a air flow substrate flattener at least at said imaging location; and imaging said planar substrates with an imager located at said imaging location, when flattened by said air flow substrate flattener.

26. The method according to claim 25 and wherein said imaging comprises acquiring an image.

27. The method according to claim 25 A and wherein said imaging comprises creating an image.

28. The method according to claim 25 and wherein said air flow conveyor comprises an air flow levitator.

29. The method according to claim 25 and wherein said air flow conveyor comprises an air flow hold down.

30. The method according to claim 25 and wherein said air flow substrate flattener functionality comprises an air flow levitator.

31. The method according to claim 25 and wherein said air flow substrate flattener comprises an air flow hold down.

32. The method according to claim 25 and wherein said conveying includes conveying said planar substrates away from said imaging location.

33. The method according to claim 25 and wherein said conveying includes displacing said planar substrates in a levitated state at least towards said imaging location.

34. The method according to claim 25 and wherein said conveying includes a displacing said planar substrates in a levitated state away from said imaging location.

35. The method according to claim 25 and wherein said planar substrates comprise an electrical circuit substrate selected from the group consisting of: printed circuit board substrates, flat panel display substrates and interconnect device substrates.

* * * * *